United States Patent
Tanaka

(10) Patent No.: US 7,130,198 B2
(45) Date of Patent: Oct. 31, 2006

(54) RESIN-PACKAGED PROTECTION CIRCUIT MODULE FOR RECHARGEABLE BATTERIES AND METHOD OF MAKING THE SAME

(75) Inventor: Naoya Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 579 days.

(21) Appl. No.: 10/310,756

(22) Filed: Dec. 6, 2002

(65) Prior Publication Data

US 2003/0228502 A1 Dec. 11, 2003

(30) Foreign Application Priority Data

Dec. 6, 2001 (JP) ............................. 2001-372504

(51) Int. Cl.
*H05K 5/00* (2006.01)
(52) U.S. Cl. ..................................... 361/730; 361/758
(58) Field of Classification Search ................ 361/730, 361/758, 752, 772; 174/52.4
See application file for complete search history.

(56) References Cited

U.S. PATENT DOCUMENTS 3,885,304 A * 5/1975 Kaiser et al. .................. 29/832
5,966,052 A * 10/1999 Sakai ........................... 331/68
6,433,420 B1 * 8/2002 Yang et al. .................. 257/712

FOREIGN PATENT DOCUMENTS

JP 08-148597 6/1996
JP 08-241700 9/1996

\* cited by examiner

*Primary Examiner*—Kamand Cuneo
*Assistant Examiner*—Ivan Carpio
(74) *Attorney, Agent, or Firm*—Michael Bednarek; Pillsbury Winthrop Shaw Pittman LLP

(57) ABSTRACT

A protection circuit module for rechargeable batteries includes a substrate, electronic components mounted on the obverse surface of the substrate for forming a protection circuit for rechargeable batteries, a housing mounted on the obverse surface of the substrate and including a top wall partially defining an enclosure for accommodating the electronic components, and a resin sealer loaded in the enclosure of the housing for sealing the electronic components. The top wall of the housing includes an opening for loading the resin sealer into the housing.

10 Claims, 7 Drawing Sheets

RESIN-PACKAGED PROTECTION CIRCUIT MODULE FOR RECHARGEABLE BATTERIES AND METHOD OF MAKING THE SAME

BACKGROUND OF THE INVENTION

1. Field of the Invention

The present invention relates to a protection circuit module for rechargeable batteries and a method of making the same.

2. Description of Related Art

A protection circuit module for rechargeable batteries prevents over-discharge from and overcharge to rechargeable batteries and is connected to the rechargeable batteries inside a battery pack for a mobile phone for example.

FIGS. 6 and 7a–7c show a conventional protection circuit module for rechargeable batteries. As shown in the figures, the protection circuit module, generally indicated by a reference numeral 61, comprises a substrate 62 in the form of a plate, a plurality of electronic components 63 mounted on the obverse surface of the substrate 62, and a resin sealer 64 sealing the electronic components 63. The substrate 62 is provided with a housing 65 enclosing the electronic components 63 and the resin sealer 64, and a conductor plate 66 is attached to each longitudinal end of the substrate 62.

The housing 65 includes a top wall 65a, a pair of lateral walls 65b extending longitudinally of the substrate 62 from the top wall 65a and a pair of end walls 65c extending widthwise of the substrate 62 from the top wall 65a. These walls define an enclosure for enclosing the resin sealer 64 and the electronic components 63. The resin sealer 64 provides waterproof effect to prevent the electronic components 63 from adversely affected by e.g. rain water coming into the battery pack of the mobile phone where the protection circuit module is incorporated. The resin sealer also protects the electronic components 63 from external force or damage.

As shown in FIGS. 7a–7c, the housing 65 has an outer surface provided with terminals 67 each including a contact portion 68a plated with gold, and the substrate 62 has a reverse surface provided with terminals 68 likewise plated with gold. These terminals 67, 68 are electrically connected to the electronic components 63, via a wiring pattern (not shown) formed on the obverse surface of the substrate 62, as well as a mobile phone body (not shown) or an external battery charger (not shown). The inner ends of the conductor plates 66 are electrically connected to the electronic components 63 via the wiring pattern (not shown) within the housing 65, whereas the outer ends projecting out of the substrate 62 are electrically connected to the rechargeable batteries (not shown) accommodated inside the battery pack (not shown).

The fabrication process of the protection circuit module 61 includes steps of mounting the electronic components 63 and the conductor plates 66 onto the substrate 62, applying the resin sealer 64 over the electronic components 63, and mounting the housing 65 onto the substrate 62. Among these three steps, the step of mounting the electronic components 63 and the conductor plates 66 as well as the step of mounting the housing 65 are both performed by reflow soldering, whereby if these two steps are performed at the same time, efficiency and productivity will improve.

However, the step of mounting the housing 65 onto the substrate 62 cannot be performed until the resin sealer 64 is applied over the electronic components 63. Therefore, these three steps must be taken one after another as long as the conventional structure shown in FIGS. 6 and 7a–7c is employed, whereby efficiency is difficult to improve.

Further, the resin sealer 64 is already applied when the housing 65 is bonded to the substrate 62 by reflow soldering, so that a heat-resistant thermosetting resin must be used for the resin sealer 64 to withstand high temperature of reflow soldering. A heat-resistant thermosetting resin, however, tends to contract when hardened, which may cause the substrate 62 to warp. Still further, a short circuit may occur between the electronic components 63 when the housing 65 is mounted to the substrate 62 by reflow soldering, because solder which serves as a bond between the substrate 62 and the electronic components 63 re-melts and expands. Still further, the screen printing method cannot be adopted for applying a solder paste to the substrate 62 after the electronic components 63 is mounted and the resin sealer 64 is applied, so that soldering for mounting the housing 65 must be performed manually, which also results in inefficiency

SUMMARY OF THE INVENTION

It is, therefore, an object of the present invention to provide a protection circuit module, wherein a plurality of electronic components and a housing can be mounted to a substrate at the same time.

It is another object of the present invention to provide a method of making such a protection circuit module.

A protection circuit module provided in accordance with a first aspect of the present invention comprises: a substrate; electronic components mounted on an obverse surface of the substrate for forming a protection circuit for rechargeable batteries; a housing mounted on the obverse surface of the substrate and including a top wall partially defining an enclosure for accommodating the electronic components; and a resin sealer loaded in the enclosure of the housing for sealing the electronic components. The top wall of the housing includes an opening for loading the resin sealer into the housing.

Functions and advantages of such a protection circuit module will be described later in detailed description of preferred embodiments.

Preferably, the opening is formed in the middle of the top wall of the housing.

Preferably, the resin sealer is hardenable at normal temperature, which may be silicone resin for example.

Preferably, the resin sealer is loaded into contact with the top wall of the housing. More preferably, the resin sealer has an exposed surface sagging gently from edges of the opening of the housing.

Preferably, the housing includes a pair of lateral walls and a pair of end walls defining the enclosure together with the top wall, the lateral walls and the end walls abutting the substrate.

In a preferred embodiment of the present invention, the housing is rectangular and includes notched spaces at four corners beneath the top wall. The housing also includes a group of terminals, each extending from the top wall to the substrate along relevant vertical walls partially defining the notched spaces. A reverse surface of the substrate may be formed with another group of terminals conductive to the electronic components. The obverse surface of the substrate may be formed with a plurality of conductor plates extending outwardly from inside the enclosure of the housing.

According to a second aspect of the present invention, a method is provided for making a protection circuit module for rechargeable batteries, the protection circuit module comprising: a substrate; electronic components mounted on an obverse surface of the substrate for forming a protection circuit for rechargeable batteries; a housing mounted on the obverse surface of the substrate and including a top wall partially defining an enclosure for accommodating the electronic components; and a resin sealer loaded in the enclosure of the housing for sealing the electronic components; wherein the top wall of the housing includes an opening for loading the resin sealer into the housing. The method comprises a step of bonding the electronic components and the housing onto the substrate simultaneously by heating, and a step of loading the resin sealer into the enclosure through the opening in the top wall of the housing.

Preferably, the step of simultaneously bonding the electronic components and the housing onto the substrate is performed by reflow soldering.

Preferably, the resin sealer is caused to harden at normal temperature after the step of loading. In that case, silicone resin may be employed for the resin sealer.

Other features and advantages of the present invention will become apparent from the following detailed description of a preferred embodiment.

BRIEF DESCRIPTION OF THE DRAWINGS

FIG. 2b is a sectional view taken along lines IIb—IIb in FIG. 2a.

DETAILED DESCRIPTION OF THE PREFERRED EMBODIMENTS

Now, a detailed description is given on a preferred embodiment of the present invention with reference to the accompanying drawings.

FIGS. 1 and 2a–2c show a protection circuit module 1 in accordance with the preferred embodiment of the present invention. FIGS. 3a and 3b show the same protection circuit module 1 incorporated in a battery pack 10 for a waterproof mobile phone for example. The protection circuit module 1, when incorporated in the battery pack 10, is connected to a plurality of rechargeable batteries (not shown) also accommodated inside the battery pack 10 for prevention of overdischarge from and overcharge to the batteries.

Figure 1:
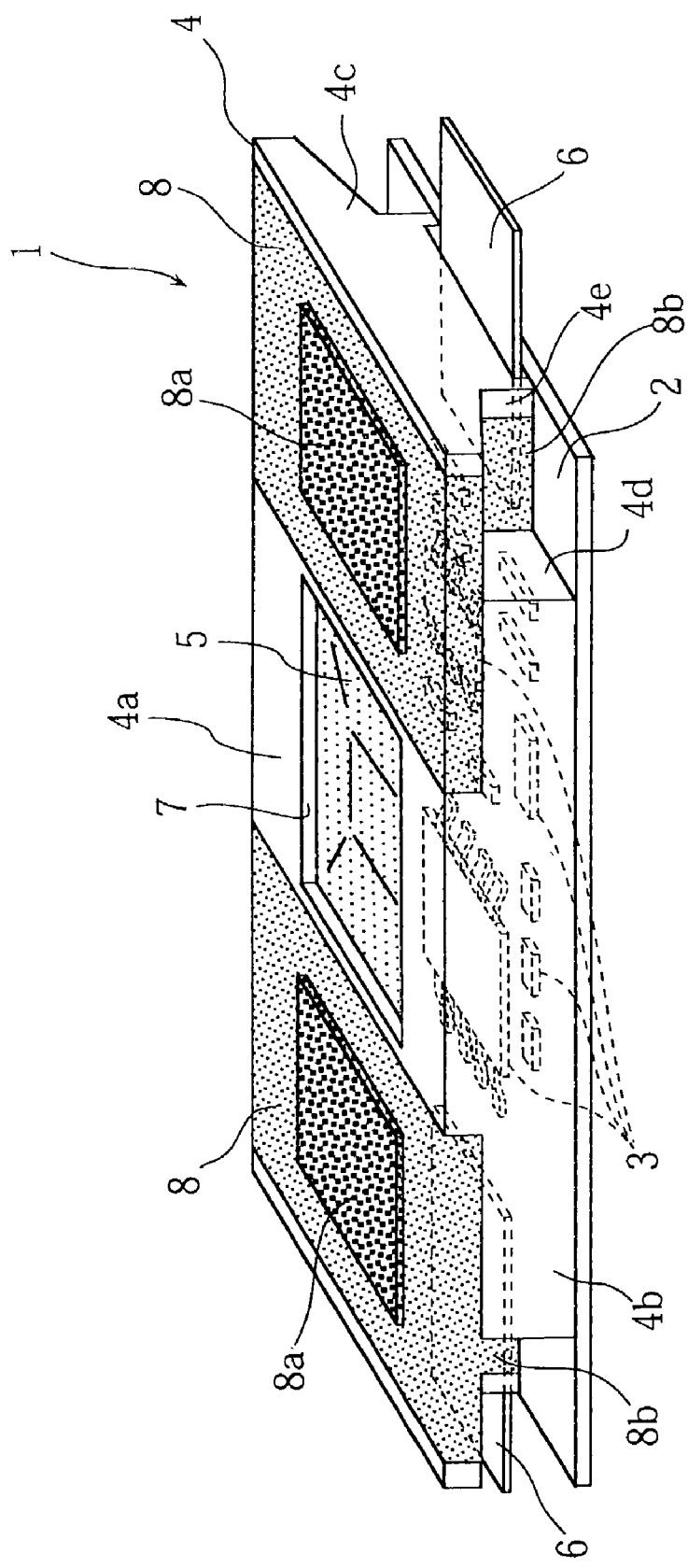
FIG. 1 is a schematic perspective view showing a protection circuit module in accordance with an embodiment of the present invention.

As shown in FIG. 1, the protection circuit module 1 comprises a substrate 2 in the form of a rectangular plate made of e.g. glass-fiber-reinforced epoxy resin, electronic components 3 mounted on the obverse surface of the substrate 2, and a housing 4 mounted on the obverse surface of the substrate 2 enclosing the electronic components 3. The housing 4 defines an enclosure filled with a resin sealer 5.

The obverse surface of the substrate 2 is provided with a wiring pattern (not shown) formed by etching a copper foil for example. This wiring pattern includes a plurality of conductor pads (not shown), and is electrically connected to the electronic components 3. The electronic components 3 are outwardly connected via these conductor pads as will be described below.

The housing 4 includes a top wall 4a corresponding in shape to the substrate 2, a pair of lateral walls 4b extending longitudinally of the substrate 2, and a pair of end walls 4c extending widthwise of the substrate 2. Conductor plates 6 are inserted into the housing 4 through the end walls 4c. The resin sealer 5 may be made of silicone resin for example, whereas the conductor plates 6 may be made of nickel for example.

The top wall 4a of the housing 4 is formed with an opening 7 at the middle thereof. As described hereinafter, the resin sealer 5 is loaded into the housing 4 through this opening 7. The lateral walls 4b and the end walls 4c, defining the periphery of the housing 4, are notched at four corners of the housing 4. In other words, each of the corners beneath the top wall 4a is formed with a notched space which is partially defined by a first vertical wall 4d extending widthwise of the substrate 2, and a second vertical wall 4e extending longitudinally of the substrate 2. The technical significance of the notched space will be explained later.

Figure 2A:
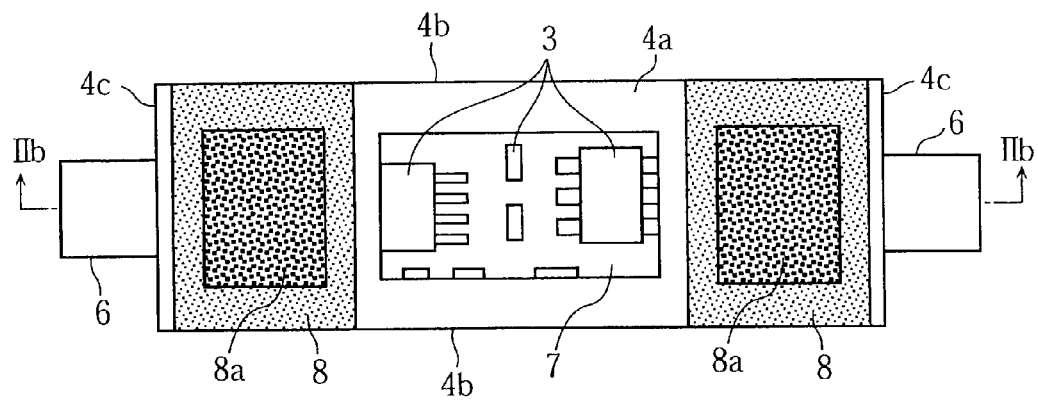
FIG. 2a is a plan view showing the protection circuit module.
Figure 2B:
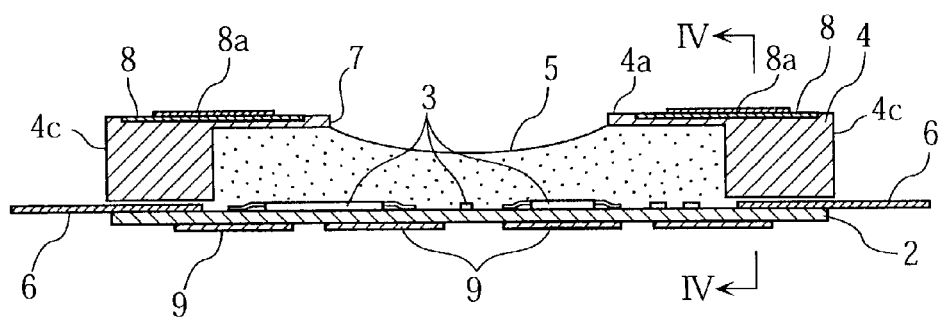
Figure 3A:
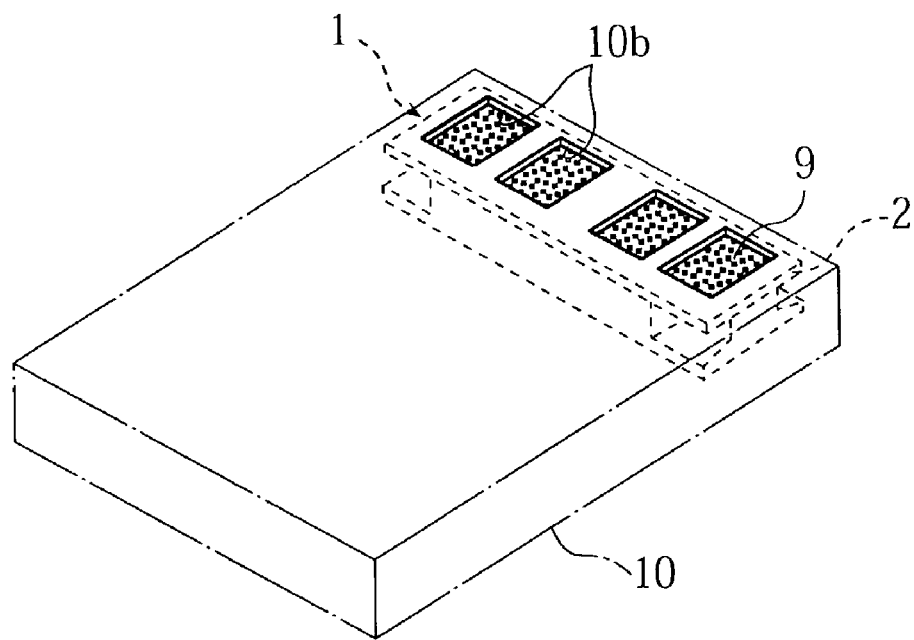
FIG. 3a is a schematic perspective view showing a battery pack with the protection circuit module incorporated inside.
Figure 3B:
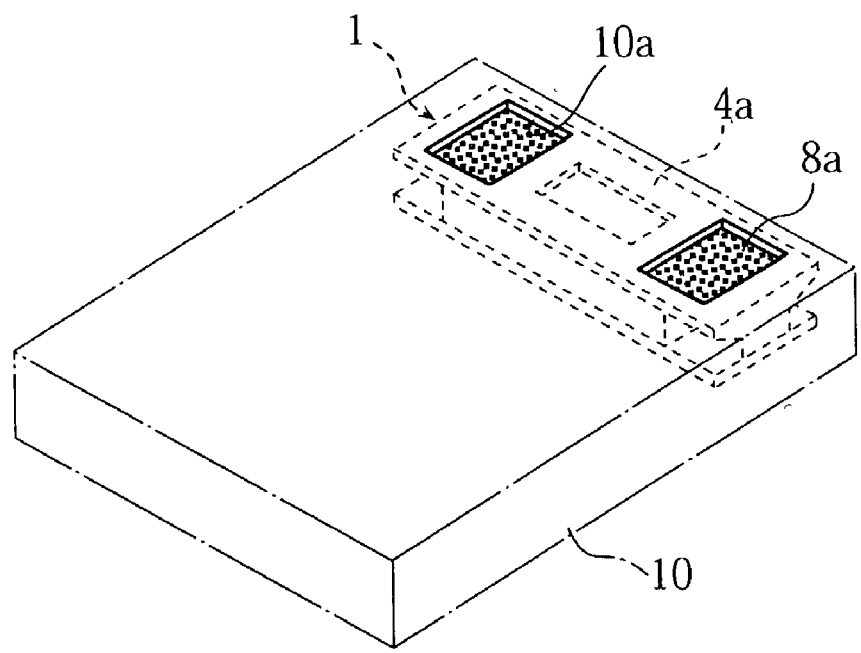
FIG. 3b is a perspective view showing the battery pack from a different angle.

As shown in FIGS. 1, 2a, and 2b, the housing 4 is formed with a first group of terminals 8. The respective terminals 8 are bent copper plates which are attached to the housing 4 by being inserted when the housing 4 is molded with resin. On the top wall 4a of the housing 4, the respective terminals 8 include a contact portion 8a plated with gold for example. When the protection circuit module 1 is enclosed in the battery pack 10 as shown in FIG. 3b, the contact portions 8a are exposed to the outside through upper openings 10a of the battery pack 10 for electrical connection to the mobile phone body (not shown).

Figure 4:
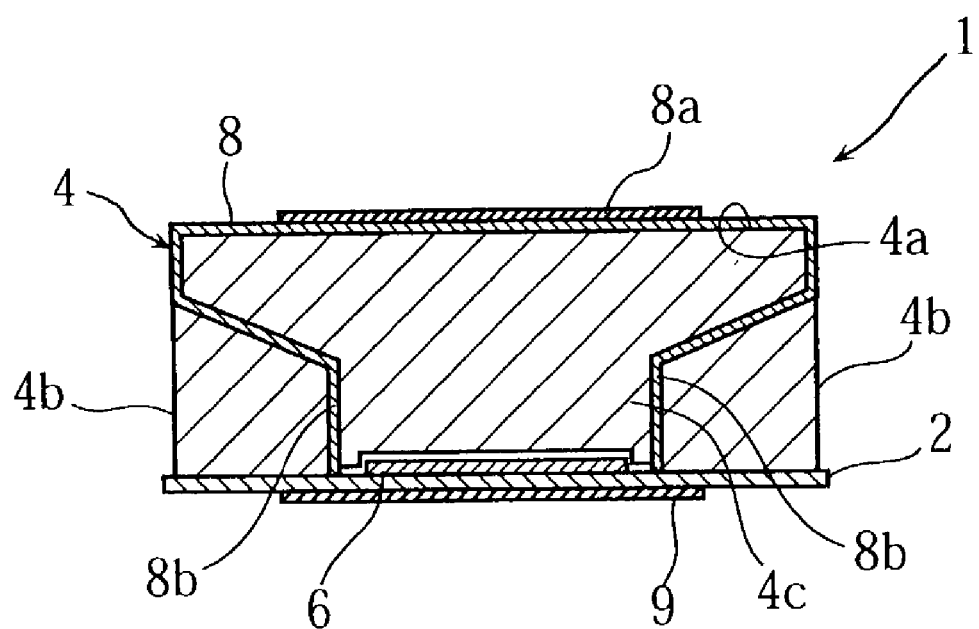
FIG. 4 is a sectional view taken along lines IV—IV in FIG. 2b.

As shown in FIG. 4, each of the terminals 8 has leg portions 8b extending from the top wall 4a of the housing 4 down to the obverse surface of the substrate 2. As previously described, each of the four corners of the housing 4 is formed with a notched space. Each leg portion 8b of the terminal 8 is exposed to the outside along the vertical wall 4e which partially defines the notched space (see FIG. 1). Therefore, the notched space may be utilized for effectively soldering the leg portion 8b of the terminal 8 and a respective conductor pad (not shown) of the wiring pattern (not shown) on the substrate 2. The notched space also facilitates visual check of the soldering.

Figure 2C:
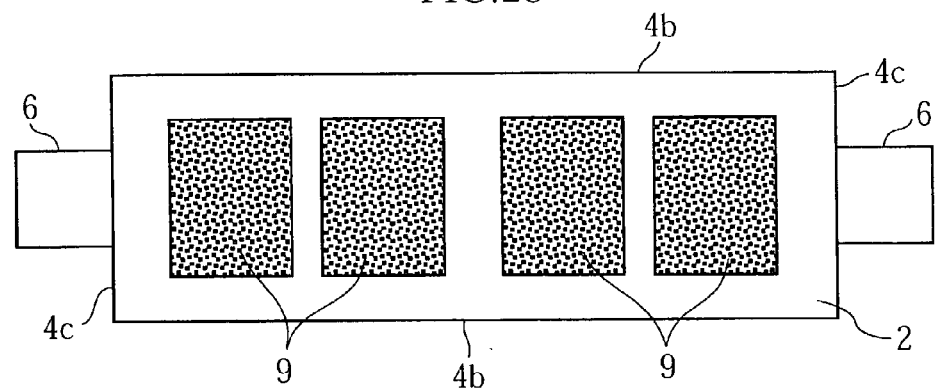
FIG. 2c is a bottom view showing the protection circuit module.

As indicated in FIGS. 2b and 2c, the reverse surface of the substrate 2 is formed with a second group of terminals 9. Each of the terminals 9 includes an outer surface plated with gold for enhancing contact conduction. When the protection circuit module 1 is incorporated in the battery pack 10 as shown in FIG. 3a, the terminals 9 are exposed to the outside through lower openings 10b of the battery pack 10 for electrical connection to an external charger (not shown) The terminals 9 are also electrically connected to the relevant conductor pads (not shown) via through-holes, lined with conductive elements, penetrating thicknesswise of the substrate 2.

One of the two conductor plates 6 operates as an anode whereas the other operates as a cathode. Within the housing 4, the inner ends of the respective conductor plates 6 are electrically connected to the electronic components 3 via the wiring pattern on the substrate 2. On the other hand, the outer ends of the respective conductor plates 6 projecting out of the substrate 2 are electrically connected to the rechargeable batteries (not shown) within the battery pack 10.

The protection circuit module 1 of the above-described structure may be fabricated in the following manner.

First, solder paste is applied by the printing method to portions of a substrate 2 where electronic components 3, a housing 4 and conductor plates 6 are to be mounted. In particular, the solder paste is applied to the relevant conductor pads (not shown) of the wiring pattern (not shown) on the substrate 2.

Then, the electronic components 3, the housing 4 and the conductor plates 6 are automatically mounted on the substrate 2 by using a holding device (not shown) such as a suction collect. At this time, the electronic components 3, the housing 4 and the conductor plates 6 are appropriately positioned relative to the relevant conductor pads (not shown) of the wiring pattern (not shown) on the substrate 2.

Then, the solder paste is heated for melting in a reflow oven, followed by cooling for solidification. In this way, the electronic components 3, the housing 4, and the conductor plates 6 are all mounted onto the substrate 2 at a time by reflow soldering.

Figure 5:
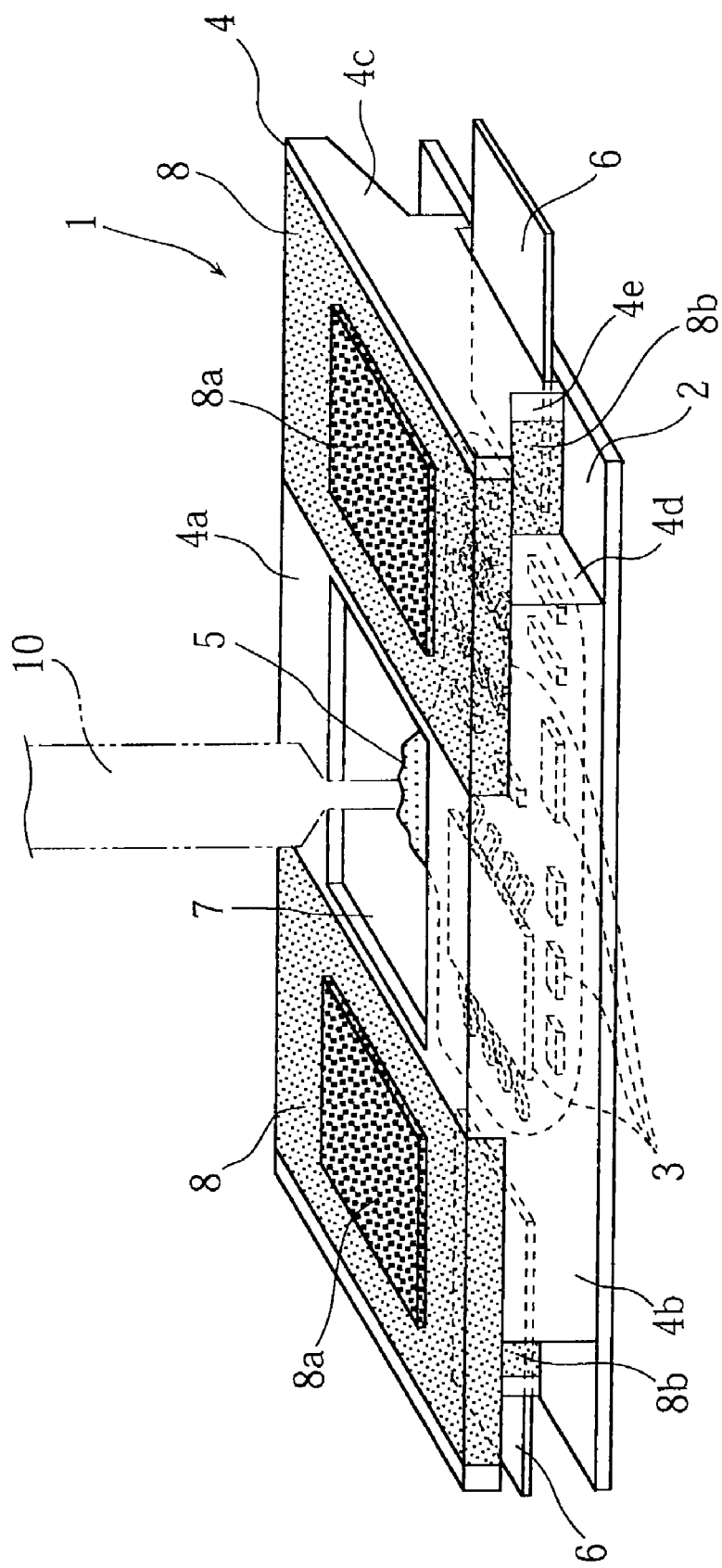
FIG. 5 is a perspective view illustrating a resin loading step in the fabrication process of the protection circuit module shown in FIG. 1.
Figure 6:
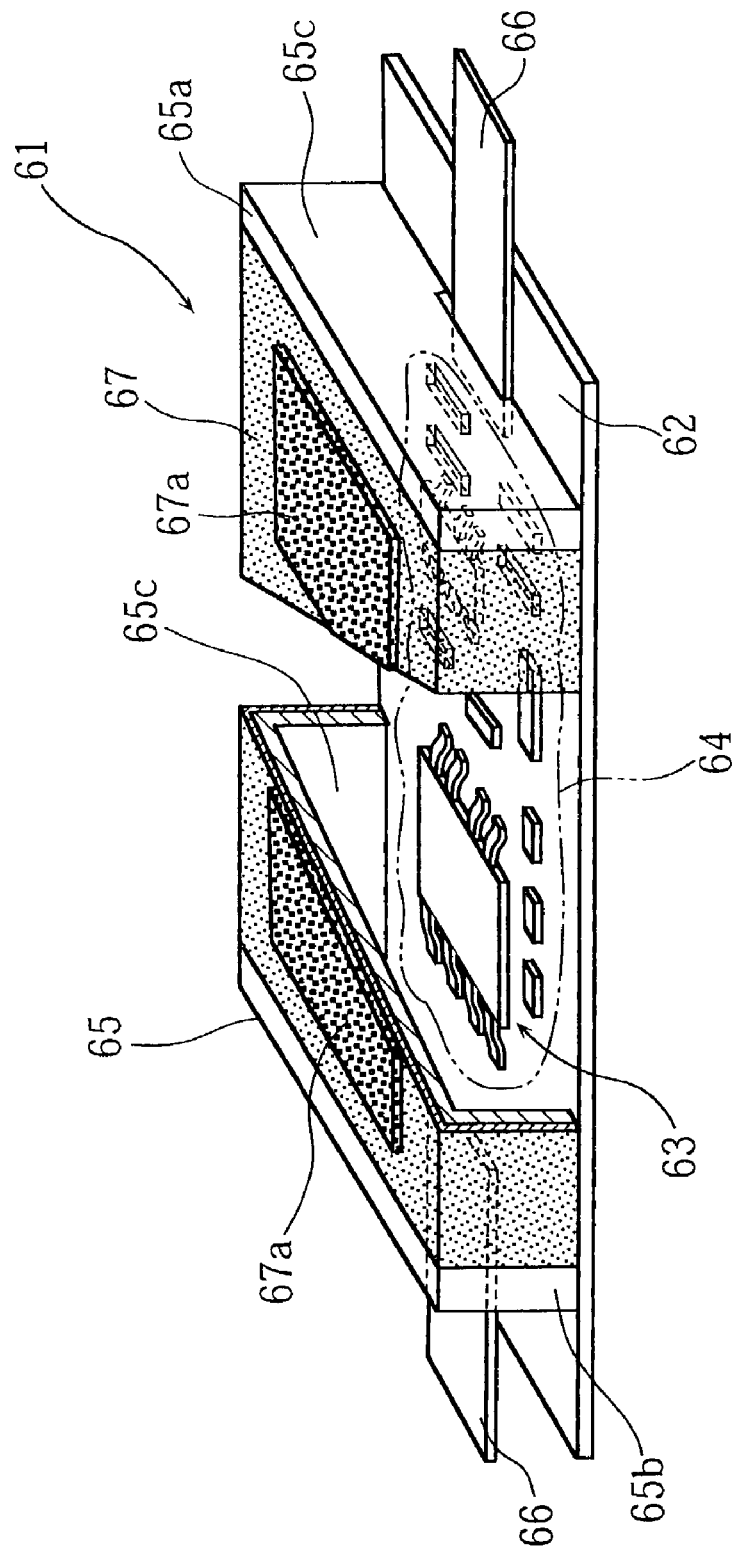
FIG. 6 is a partially broken perspective view showing a conventional protection circuit module.
Figure 7A:
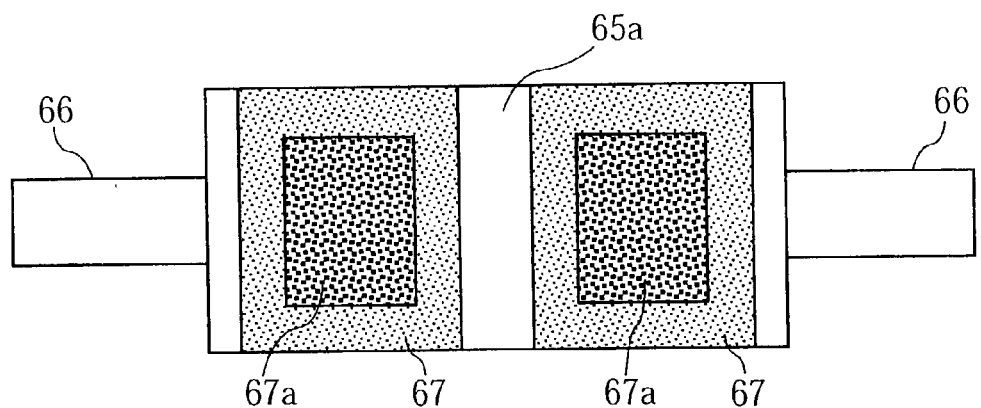
FIG. 7a is a plan view showing the conventional protection circuit module.
Figure 7B:
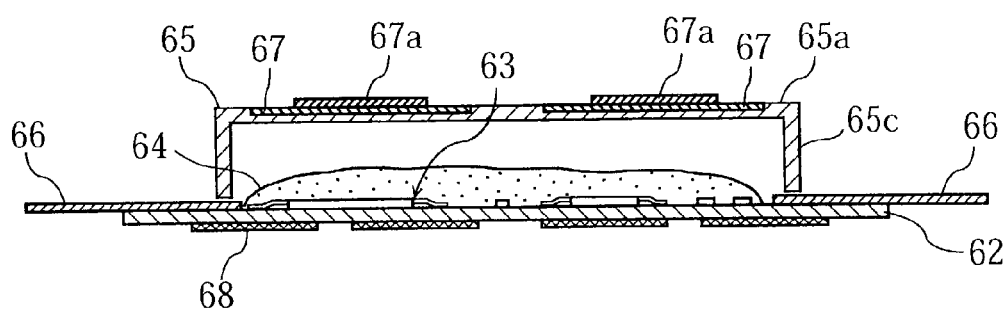
FIG. 7b is a longitudinal sectional view showing the conventional protection circuit module.
Figure 7C:
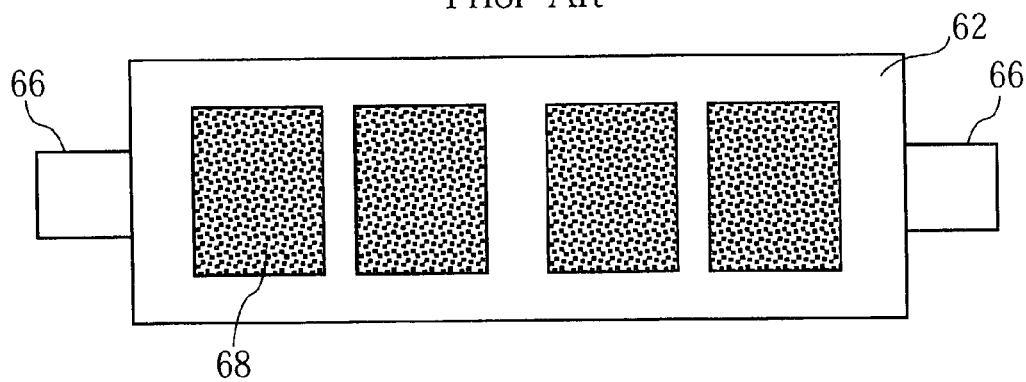
FIG. 7c is a bottom view showing the conventional protection circuit module.

Finally, as shown in FIG. 5, the housing 4 is filled with a resin sealer 5 by using an injection nozzle 10 inserted into the housing 4 through the opening 7 formed in the top wall 4a, for sealing all the electronic components 3. The extent of the resin filling is such that the resin does not leak through clearances between the housing 4 and the substrate 2, nor does it overflow onto the top wall 4a of the housing 4 above the opening 7. Specifically, as shown in FIG. 2b, the resin filling is performed until an exposed surface of the resin sealer 5 at the opening 7 sags gently from the edges of the opening 7.

The protection circuit module 1 is thus completed by the above-described method. In this method, since the opening 7 is formed in the top wall 4a of the housing 4, the housing 4 can be mounted to the substrate 2 before the resin sealer 5 is loaded for waterproof treatment of the electronic components 3. Therefore, the electronic components 3, the housing 4, and the conductor plates 6 are all mounted to the substrate 2 at the same time by reflow soldering. As a result, the efficiency of the fabrication process improves by automating the series of process steps which include applying the solder paste onto the substrate 2, mounting the electronic components 3, the housing 4 and the conductor plates 6 onto the substrate 2 by reflow soldering, and waterproofing the electronic components 3 (filling the resin sealer 5). The filling of the resin sealer 5 can be performed after the reflow soldering treatment which requires heating, whereby there is no need to consider heat resistance and silicone resin hardenable at normal temperature without contraction may be employed as the resin sealer 5.

In the embodiment shown in the figures, since the opening 7 formed in the middle of the top wall 4a of the housing 4 is relatively large, heat inside the reflow oven can be efficiently led into the housing 4, and the housing 4 can be filled almost uniformly with the resin sealer 5. Further, the lateral walls 4b and the end walls 4c abut on the substrate 2 to restrain leakage of the resin sealer 5 filled in the housing, thereby reducing the disadvantages that would otherwise arise from resin leakage.

The preferred embodiment of the present invention being thus described, the present invention is not limited to that embodiment. For example, shapes of the housing 4 and the opening 7 are not limited to those shown in the figures, and shapes, sizes, and positions of the conductor plates 6 and the terminals 8, 9 are not limited to those in the figures. The solder paste is not necessarily applied in advance to the substrate 2, but can be applied in advance to the electronic components 3 mounted on the substrate 2. Therefore, the present invention can be varied in various ways unless the variations depart from the spirit and the scope of the claims given below.

The invention claimed is:

1. A protection circuit module for rechargeable batteries comprising:
    a substrate;
    electronic components mounted on an obverse surface of the substrate for forming a protection circuit for rechargeable batteries;
    a housing mounted on the obverse surface of the substrate and including a top wall partially defining an enclosure for accommodating the electronic components; a plurality of terminals provided on the housing; and
    a resin sealer loaded in the enclosure of the housing for sealing the electronic components;
    wherein the top wall of the housing includes an opening for loading the resin sealer into the housing;
    wherein the housing is rectangular and includes notched spaces at four corners of the housing beneath the top wall, the plurality of terminals being exposed at the notched spaces at least partially.

2. The protection circuit module for rechargeable batteries according to claim 1, wherein the opening is formed in the middle of the top wall of the housing.

3. The protection circuit module for rechargeable batteries according to claim 1, wherein the resin sealer is hardenable at normal temperature.

4. The protection circuit module for rechargeable batteries according to claim 3, wherein the resin sealer is silicone resin.

5. The protection circuit module for rechargeable batteries according to claim 1, wherein the resin sealer is loaded into contact with the top wall of the housing.

6. The protection circuit module for rechargeable batteries according to claim 5, wherein the resin sealer has an exposed surface sagging gently from edges of the opening of the housing.

7. The protection circuit module for rechargeable batteries according to claim 1, wherein the housing includes a pair of lateral walls and a pair of end walls defining the enclosure together with the top wall, the lateral walls and the end walls abutting the substrate.

8. The protection circuit module for rechargeable batteries according to claim 1, wherein each of the terminals extends from the top wall to the substrate along relevant vertical walls partially defining the notched spaces.

9. The protection circuit module for rechargeable batteries according to claim 1, wherein a reverse surface of the substrate is formed with another group of terminals conductive to the electronic components.

10. The protection circuit module for rechargeable batteries according to claim 1, wherein the obverse surface of the substrate is formed with a plurality of conductor plates extending outwardly from inside the enclosure of the housing.

* * * * *